(12) United States Patent
Ishii et al.

(10) Patent No.: US 9,954,199 B2
(45) Date of Patent: Apr. 24, 2018

(54) DISPLAY DEVICE

(71) Applicant: Japan Display Inc., Tokyo (JP)

(72) Inventors: Yoshinori Ishii, Tokyo (JP); Toshihiro Sato, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

(21) Appl. No.: 15/230,623

(22) Filed: Aug. 8, 2016

(65) Prior Publication Data

US 2017/0047541 A1 Feb. 16, 2017

(30) Foreign Application Priority Data

Aug. 10, 2015 (JP) ................. 2015-158053

(51) Int. Cl.
| | |
|---|---|
| *H01L 51/56* | (2006.01) |
| *H01L 51/52* | (2006.01) |
| *H01L 51/00* | (2006.01) |
| *H01L 27/32* | (2006.01) |

(52) U.S. Cl.
CPC ...... *H01L 51/5246* (2013.01); *H01L 27/3244* (2013.01); *H01L 51/0096* (2013.01); *H01L 51/56* (2013.01); *H01L 2251/566* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | | |
|---|---|---|---|---|
| 2003/0168966 A1* | 9/2003 | Kobayashi | .......... | H01L 27/3246 313/495 |
| 2012/0171425 A1* | 7/2012 | Tseng | .................. | G02F 1/1339 428/156 |
| 2013/0003006 A1* | 1/2013 | Wang | .................. | G02F 1/1339 349/138 |
| 2014/0104529 A1* | 4/2014 | Ikeda | .................... | G02F 1/136 349/43 |

FOREIGN PATENT DOCUMENTS

JP 2008-108679 A 5/2008

\* cited by examiner

*Primary Examiner* — Charles Garber
*Assistant Examiner* — Alia Sabur
(74) *Attorney, Agent, or Firm* — Typha IP LLC (57) ABSTRACT

A display device includes a first substrate that is provided with a display element in a display region, a second substrate that faces the first substrate, and a sealant that bonds the first substrate and the second substrate to each other in a region surrounding the periphery of the display region in a plan view, in which each of the first substrate and the second substrate has a rectangular shape, in which at least one of the first substrate and the second substrate has a corner portion and a recess formed at a position which is close to the corner portion and overlaps at least a part of the region in which the sealant is disposed, and in which the sealant is provided to be in contact with at least a surface far from the display region among inner surfaces of the recess.

14 Claims, 9 Drawing Sheets

DISPLAY DEVICE

CROSS-REFERENCE TO RELATED APPLICATION

The present application claims priority from Japanese application JP2015-158053 filed on Aug. 10, 2015, the content of which is hereby incorporated by reference into this application.

BACKGROUND OF THE INVENTION

1. Field of the Invention

The present invention relates to a display device.

2. Description of the Related Art

JP2008-108679A discloses a display device including a seal member which is disposed in a frame-shaped seal region outside a display region and bonds an array substrate to a sealing substrate.

SUMMARY OF THE INVENTION

As a method of manufacturing a small or medium-sized display device, there is a method of dividing a large-sized multi-piece panel into pieces so that a display device with a desired size is obtained. The multi-piece panel is formed of a pair of glass substrates bonded to each other, and each of the pair of glass substrates is scribed (for example, engraved with a metal needle or the like, or engraved with laser light), and then is broken (divided along scribed notches) so that a plurality of display devices with a predetermined size can be obtained.

Here, typically, a pair of glass substrates are bonded to each other by using a sealant, but, in a case where a distance between a scribe line, that is, a break line and the sealant is nonuniform, force applied to the glass substrate during breaking is nonuniform, and thus there is concern that a sectional shape of the glass substrate of each display device may be deteriorated due to the breaking.

Such deterioration of the sectional shape may be derived from the generation of micro-cracks in the glass substrate forming a part of a display device.

In a sheet display, in a case where a distance between a substrate end and a sealant is nonuniform, peeling or the like of the sheet display occurs.

An object of the present invention is to provide a display device with a glass substrate in which deterioration of a sectional shape is suppressed.

The above-described object and other objects, and novel features of the present invention will become apparent through description of the present specification and the accompanying drawings.

According to an aspect of the present invention, there is provided a display device including a first substrate that is provided with a display element in a display region; a second substrate that faces the first substrate and is disposed on a side of the first substrate where the display element is provided; and a sealant that bonds the first substrate and the second substrate to each other in a region surrounding the periphery of the display region in a plan view. Each of the first substrate and the second substrate has a rectangular shape. At least one of the first substrate and the second substrate has a corner portion and a recess formed at a position which is close to the corner portion and overlaps at least a part of the region in which the sealant is disposed. The sealant is provided to be in contact with at least a surface far from the display region among inner surfaces of the recess.

According to another aspect of the present invention, there is provided a display device including a first substrate that has a display region in which a plurality of display elements are disposed, and a peripheral region surrounding the display region; a second substrate that faces the first substrate; and a sealant that is interposed between the first substrate and the second substrate, and is located in the peripheral region. The peripheral region includes a first region which is close to an end of the first substrate and is provided in a portion in which a thickness of the first substrate is a first thickness; a second region which is located between the first region and the display region and is provided in a portion in which a thickness of the first substrate is a second thickness; and a third region which is located between the second region and the display region and is provided in a portion in which a thickness of the first substrate is a third thickness. Each of the first thickness and the third thickness is larger than the second thickness thereby forming a recess having a bottom on the second region. The sealant includes a first sealant extending in a first direction and a second sealant extending in a second direction intersecting the first direction. An intersection where the first sealant and the second sealant intersect each other is located in a region overlapping the second region in a plan view.

DETAILED DESCRIPTION OF THE INVENTION

Hereinafter, embodiments of the present invention will be described in detail, but embodiments of the present invention are not limited to the following examples.

Display Device of First Embodiment

Figure 1:
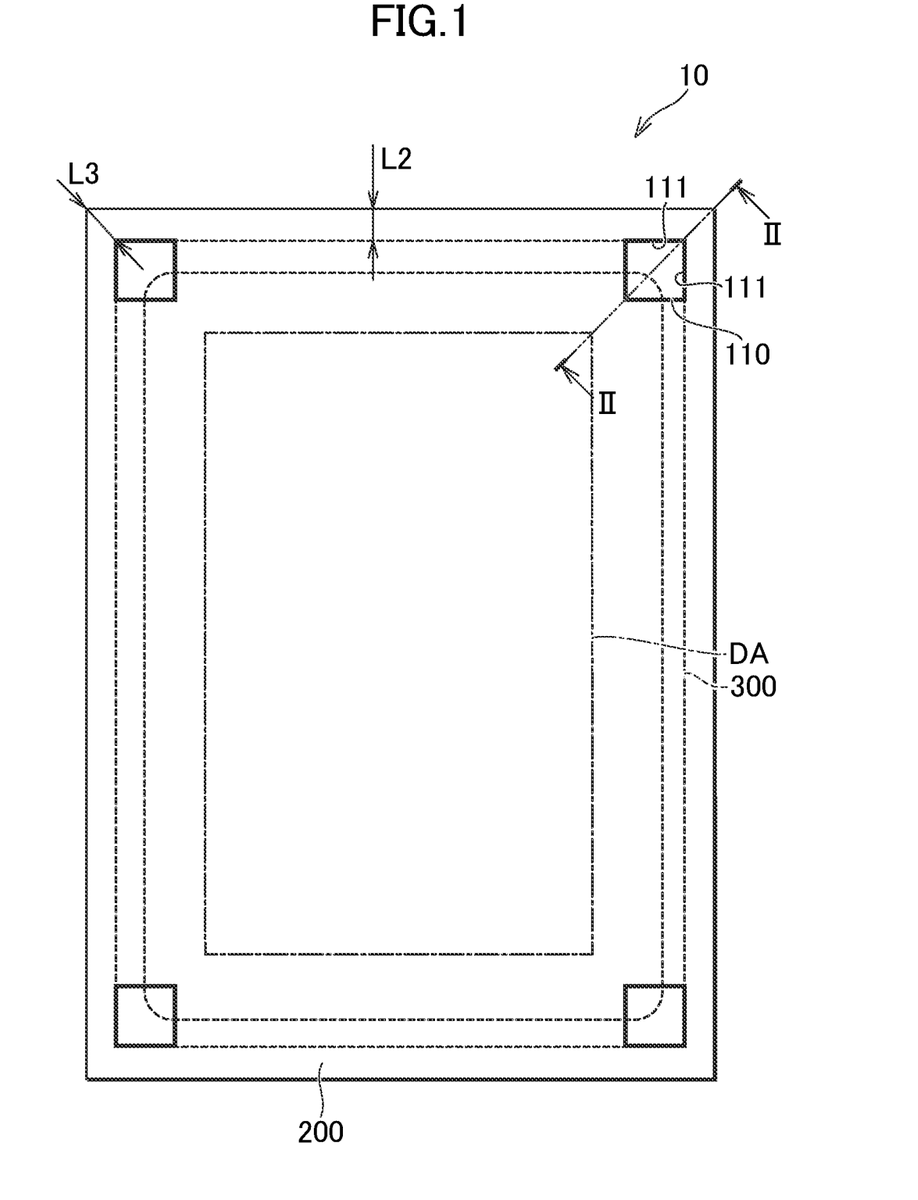
FIG. 1 is a plan view of a display device according to a first embodiment of the present invention.
Figure 2:
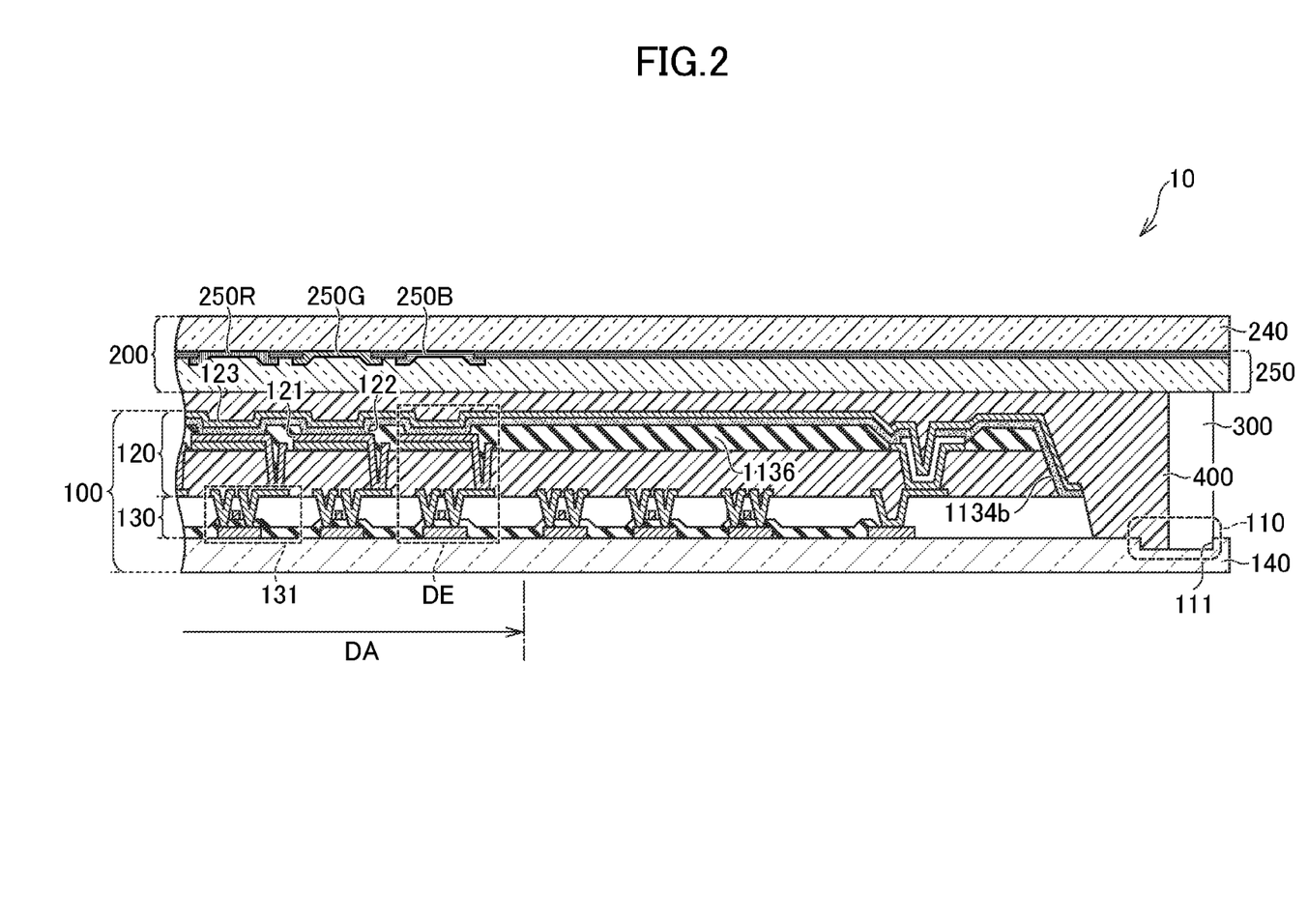
FIG. 2 is a sectional view taken along the line II-II in FIG. 1.

First, with reference to FIGS. 1 and 2, a description will be made of a summary of a display device of the present embodiment, and a configuration of the display device of the present embodiment. FIG. 1 is a plan view of the display device according to the first embodiment of the present invention. FIG. 2 is a sectional view taken along the line II-II in FIG. 1.

As illustrated in FIGS. 1 and 2, a display device 10 of the present embodiment includes a first substrate 100 in which display elements DE are provided in a display region DA; a second substrate 200 provided to face the first substrate 100 on the side where the display elements DE of the first substrate 100 are provided; and a sealant 300 which bonds the first substrate 100 and the second substrate 200 to each other in a region surrounding the display region DA in a plan view. Each of the first substrate 100 and the second substrate 200 has a rectangular shape, and at least one of the first substrate 100 and the second substrate 200 has corner portions and recesses 110 formed at positions which are close to the corner portions and overlap at least a part of the region in which the sealant 300 is disposed. The sealant 300 is provided to be in contact with at least surfaces 111 far from the display region DA among inner surfaces of the recess 110.

The display element DE included in the display device 10 may be a spontaneous light emission type display element, and may be a liquid crystal display element. The spontaneous light emission type display element may be, for example, an organic EL display element with an organic light emission layer including an electron transport layer, a hole transport layer, an electron injection layer, and a hole injection layer as light emission layers, or an inorganic light emitting element whose representative is a quantum-dot light emitting diode (QLED).

In the following description, as an example, the display device 10 of the first embodiment is an organic EL display device in which an organic EL display element which is a spontaneous light emission type display element including an organic light emission layer 120 is provided as the display element DE.

In the present specification, the organic light emission layer 120 is not limited to a layer made of only an organic material, and may include a layer made of an organic material and a layer made of an inorganic material. In other words, the organic light emission layer 120 may be a layer including an organic layer made of an organic material and an electrode layer made of an inorganic material.

In other words, the display element DE of the display device 10 according to the first embodiment is configured to include the organic light emission layer 120 and a TFT layer 130 which will be described later.

As illustrated in FIGS. 1 and 2, the first substrate 100 forming a part of the display device 10 according to the first embodiment maybe configured to include the TFT layer 130 in which unit pixels each having a thin film transistor (TFT) 131 are disposed in a matrix on an insulating substrate 140, and the organic light emission layer 120 provided on the TFT layer 130. The insulating substrate 140 may be formed of a glass substrate, and may be formed of a resin substrate.

The thin film transistor 131 forming a part of the TFT layer 130 may include a semiconductor film such as polysilicon, a gate insulating film covering the semiconductor film, a gate electrode disposed over the semiconductor film via the gate insulating film, and a source electrode and a gate electrode which penetrate through the gate insulating film so as to be electrically connected to the semiconductor film. A driving circuit (not illustrated) for driving the thin film transistor 131 forming a part of the TFT layer 130 may be disposed on the first substrate.

Next, the organic light emission layer 120 will be described. The organic light emission layer 120 forming a part of the display device 10 of the first embodiment includes a plurality of pixel electrodes 121 which are provided on the TFT layer 130 side and respectively correspond to pixels, a light emission layer 122 covering the respective pixel electrodes 121, and a common electrode 123 formed on the light emission layer 122. In the present embodiment, the light emission layer 122 includes an electron transport layer, a hole transport layer, an electron injection layer, a hole injection layer, and the like (not illustrated).

A current is supplied to each of the pixel electrodes 121 included in the organic light emission layer 120 via the thin film transistor 131 provided in the TFT layer 130, and the current supplied to the pixel electrode 121 flows into the common electrode 123 via the light emission layer 122. The light emission layer 122 interposed between the pixel electrode 121 and the common electrode 123 emits light due to recombination of electrons and holes supplied from the respective electrodes. The emitted light is transmitted through the second substrate 200 and is applied to the outside.

The second substrate 200 maybe, for example, a color filter (CF) substrate which is provided to face the first substrate 100. In this case, the second substrate 200 may be a substrate in which a color filter layer 250 is disposed on an insulating substrate 240. The insulating substrate 240 may be formed of a glass substrate, and may be formed of a resin substrate, in the same manner as the insulating substrate 140 provided on the first substrate.

Here, the organic light emission layer 120 provided on the first substrate 100 of the display device 10 according to the first embodiment emits light with a single color (white). As illustrated in FIG. 2, in a case where the color filter layer 250 is configured to include colored layers (250R, 250G, and 250B) such as red (R), green (G), and blue (B), light (white) emitted from the organic light emission layer 120 passes through the colored layers 250R, 250G, and 250B with corresponding colors, and thus colors such as red (R), green (G), and blue (B) are viewed from the outside.

In a case where the organic light emission layer 120 does not emit light with a single color (white) but emits color light such as red (R), green (G), and blue (B) corresponding to pixels, the second substrate 200 is not required to have a color filter layer, and may be formed of only a transparent insulating substrate 240 for protecting the display elements DE and the like.

As illustrated in FIGS. 1 and 2, the display device 10 according to the first embodiment includes the sealant 300 bonding the first substrate 100 to the second substrate 200 in a region surrounding the display region DA in a plan view.

The sealant 300 may be formed by curing, for example, a liquid or paste photocurable resin.

As illustrated in FIG. 1, each of the first substrate 100 and the second substrate 200 has a rectangular shape. The first substrate 100 of the display device 10 according to the first embodiment is provided with the recesses 110 formed at positions which are close to corner portions of the first substrate 100 and overlap at least a part of the region in which the sealant 300 is disposed, in a plan view.

The sealant 300 is provided to be in contact with the surfaces 111 far from at least the display region DA among the inner surfaces of the recess 110 formed in the first substrate 100. In other words, the sealant 300 is provided along the surfaces 111 far from the display region DA among the inner surfaces of the recess 110 formed in the first substrate 100.

In a case where the display device 10 is manufactured according to a method using a multi-piece panel, a distance between the scribe line (break line) and the sealant 300 at the corner portion of the first or second substrate forming the display device 10 tends to be longer than a distance therebetween at a side portion for the reason which will be described later. Thus, a sectional shape after the first or second substrate is broken at the corner portion is easily deteriorated.

During manufacturing of the display device 10 according to the first embodiment, four recesses 110 are formed in advance at the positions close to four corner portions of the first or second substrate so that a distance between the scribe line (break line) and the sealant 300 is uniform. Each of the plurality of recesses 110 is not connected to the other recesses 110, and is formed separately from each other.

Thus, it is possible to provide the display device 10 in which deterioration of a sectional shape occurring at the corner portion of the first or second substrate is suppressed.

As illustrated in FIG. 2, in the display device 10 according to the first embodiment, a gap between the first substrate 100 and the second substrate 200 may be filled with a fill material 400. The fill material 400 seals functional layers such as the TFT layer 130 and the organic light emission layer 120 formed on the first substrate 100.

In the same manner as the sealant 300, the fill material 400 may be formed by curing a liquid or paste photocurable resin or the like.

Hereinafter, with reference to FIGS. 3, 4A, 4B, 4C and 4D, a description will be made of a method of manufacturing the display device 10 according to the first embodiment in a case where a liquid or paste photocurable resin is used as the sealant 300. In FIGS. 3, 4A, 4B, 4C and 4D, specific configurations of the first substrate 100 and the second substrate 200 are not illustrated.

In the description of the method of manufacturing the display device 10 of the first embodiment, a description will also be made of the reason why a distance between a scribe line (break line) SL and the sealant 300 is likely to be nonuniform at the corner portion of the first or second substrate.

Figure 3:
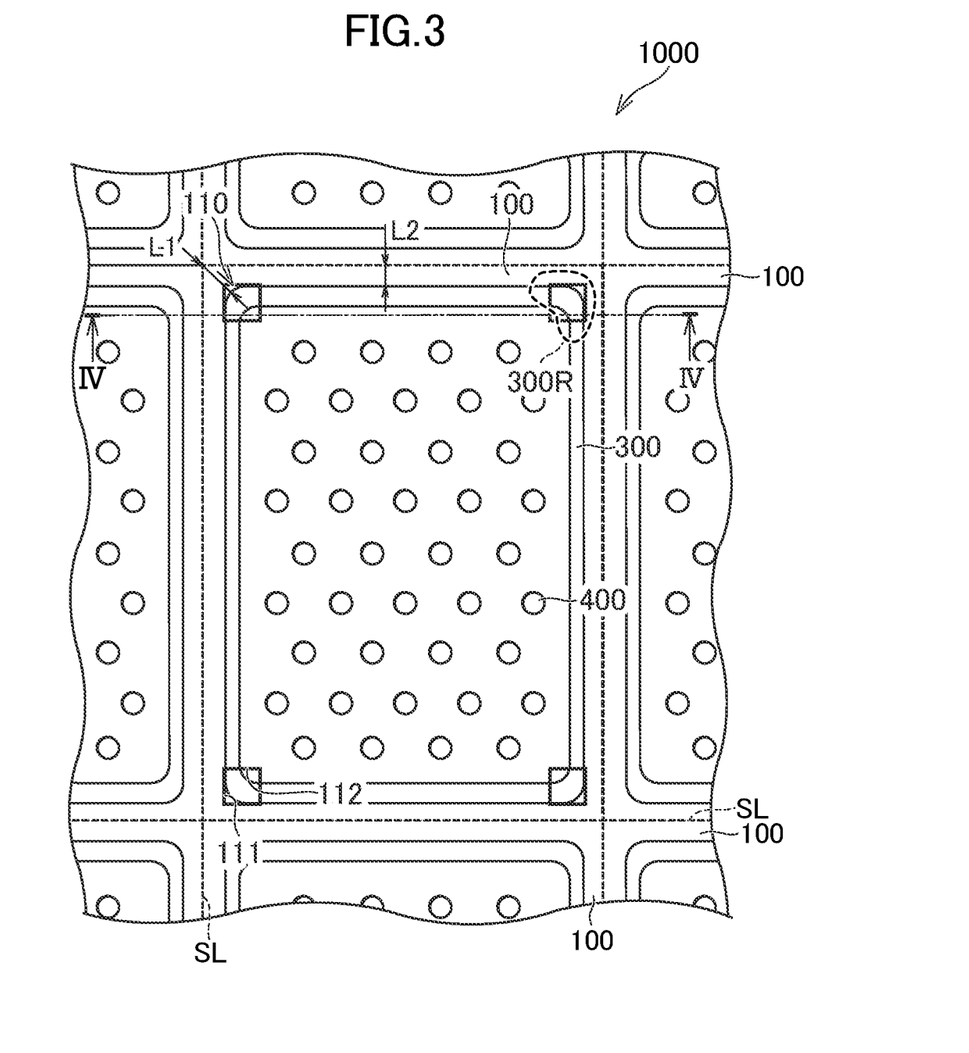
FIG. 3 is a diagram for explaining a method of manufacturing the display device of the first embodiment, and is a plan view illustrating a state in which a sealant and a fill material are applied on a multi-piece panel forming a plurality of first substrates on which recesses are formed.
Figure 4A:
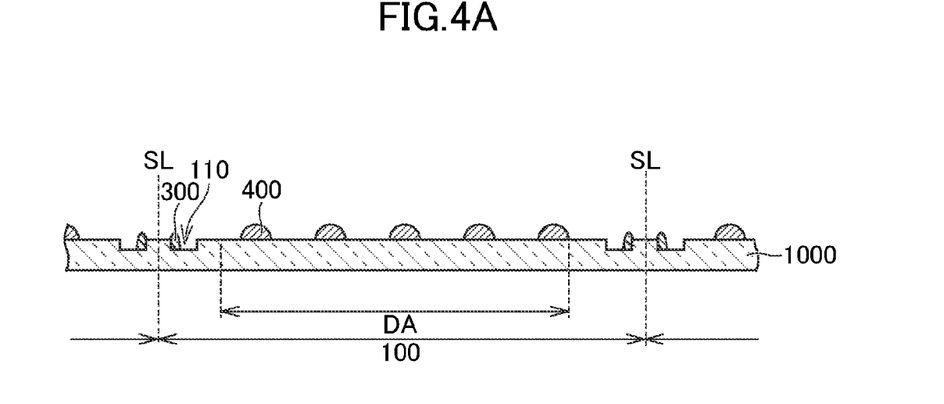
FIG. 4A is a sectional view taken along the line IV-IV in FIG. 3.

FIG. 3 is a diagram for explaining the method of manufacturing the display device 10 of the first embodiment, and is a plan view illustrating a state in which the sealant 300 and the fill material 400 are applied on a multi-piece panel 1000 forming a plurality of first substrates 100 on which the recesses 110 are formed. FIG. 4A is a sectional view taken along the line IV-IV in FIG. 3.

As illustrated in FIGS. 3 and 4A, a photocurable resin as a material of the sealant 300 is drawn on the multi-piece panel 1000 forming a plurality of first substrates 100 so as to surround the display region DA by using, for example, a dispenser. A photocurable resin as a material of the fill material 400 is dropped so as to be applied in a region surrounded by the photocurable resin as a material of the sealant 300.

If the liquid or paste photocurable resin is drawn by using the dispenser or the like, a corner portion 300R of the photocurable resin is drawn in a curved shape as illustrated in FIG. 3. Here, in a case where the multi-piece panel 1000 forming the first substrate 100 and a multi-piece panel forming the second substrate 200 are bonded together, and both of the substrates are broken, a distance (L1 in FIG. 3) between the corner portion of the first substrate 100 or the second substrate 200 and the sealant 300 is longer than a distance (L2 in FIG. 3) between a portion other than the corner portion of the first substrate 100 or the second substrate 200 and the sealant 300.

Consequently, force applied to the corner portion is different from force applied to other portions during breaking of the substrate. A sectional shape obtained after breaking the first substrate 100 or the second substrate 200 to which the different force has been applied tends to be nonuniform between the corner portion and other portions, and, as a result, there is a high probability that micro-cracks may be generated.

In contrast, in manufacturing of the display device 10 according to the first embodiment, a distance between the sealant 300 and the scribe line (break line) can be made shorter, and thus the generation of micro-cracks is reduced.

Figure 4B:
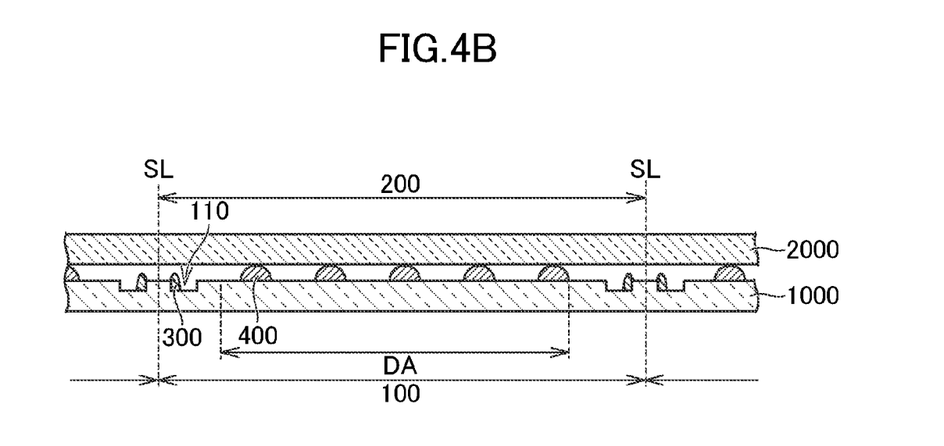
FIG. 4B is a diagram for explaining the method of manufacturing the display device of the first embodiment, and is a sectional view illustrating a state in which a scribe line (break line) of a multi-piece panel forming a first substrate and a scribe line (break line) of a multi-piece panel forming a second substrate are positioned with each other, and the multi-piece panels forming both of the substrates are bonded together.

FIG. 4B is a diagram for explaining the method of manufacturing the display device of the first embodiment, and is a sectional view illustrating a state in which a scribe line (break line) of a multi-piece panel forming a first substrate 100 and a scribe line (break line) of a multi-piece panel forming a second substrate are positioned with each other, and the multi-piece panels forming both of the substrates are bonded together.

The photocurable resins as respective materials of the sealant 300 and the fill material 400 are applied on the multi-piece panel 1000 forming the first substrate 100, and then a multi-piece panel 2000 forming the second substrate 200 is aligned at positions where the scribe lines SL of both of the substrates match each other, so that both of the panels are bonded to each other.

At this time, both of the photocurable resins may start to be cured by irradiating the respective photocurable resins as materials of the sealant 300 and the fill material 400 with light (for example, ultraviolet (UV) light) having a wavelength causing starting of curing.

Bonding between the multi-piece panel 1000 forming the first substrate 100 and the multi-piece panel 2000 forming the second substrate 200 may be performed in vacuum. Both of the substrates are bonded to each other in vacuum, and this is preferable since air can be notably prevented from entering between the substrates, particularly, the display region DA in a plan view.

Figure 4C:
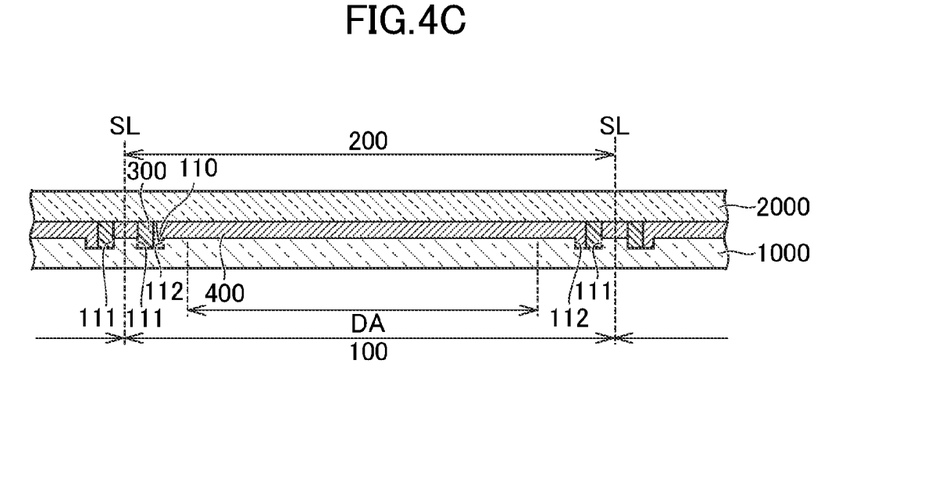
FIG. 4C is a diagram for explaining the method of manufacturing the display device of the first embodiment, and is a sectional view illustrating a state in which a process of pressing and bonding the multi-piece panel forming the first substrate and the multi-piece panel forming the second substrate is completed.

FIG. 4C is a diagram for explaining the method of manufacturing the display device of the first embodiment, and is a sectional view illustrating a state in which a process of pressing and bonding the multi-piece panel forming the first substrate 100 and the multi-piece panel forming the second substrate is completed.

Both of the multi-piece panels 1000 and 2000 are pressed, and thus the sealant 300 is provided to be in contact with the surfaces 111 far from the display region DA among the inner surfaces of the recess 110. In other words, the sealant 300 is provided along the surfaces 111 far from the display region DA among the inner surfaces of the recess 110.

In the process, the sealant 300 buried in the recess 110 along the shape of the recess 110 stays inside the recess 110, and thus does not spread toward the region on an opposite side to the display region DA with the recess 110 interposed therebetween. Consequently, a distance between the sealant 300 and the corner portion of the substrate is L3 as illustrated in FIG. 1. In other words, a distance, illustrated in FIG. 3, between the sealant 300 and the corner portion of the substrate is a value closer to L2 than in a case where there is no recess 110.

In other words, in the display device 10 according to the first embodiment, a distance between the scribe line (break line) SL and the sealant 300 is more uniform than in a case where there is no recess 110, and thus it is possible to reduce a probability that a sectional shape after breaking may be deteriorated.

The first substrate 100 and the second substrate 200 are pressed or are bonded to each other in a decompressed atmosphere, and the fill material 400 is formed to enter the recess 110 along surfaces 112 close to the display region DA among the inner surfaces of the recess 110. In other words, the sealant 300 is provided to be separated from at least some of the surfaces 112 close to the display region DA among the inner surfaces of the recess 110.

As mentioned above, the fill material 400 enters the recess 110 along the surfaces 112 close to the display region DA among the inner surfaces of the recess 110, and, thus, even if air is mixed with the fill material 400 during manufacturing, the air is driven into the recess provided outside the display region DA. Therefore, it is possible to minimize the occurrence of display defects in the manufactured display device 10.

Figure 4D:
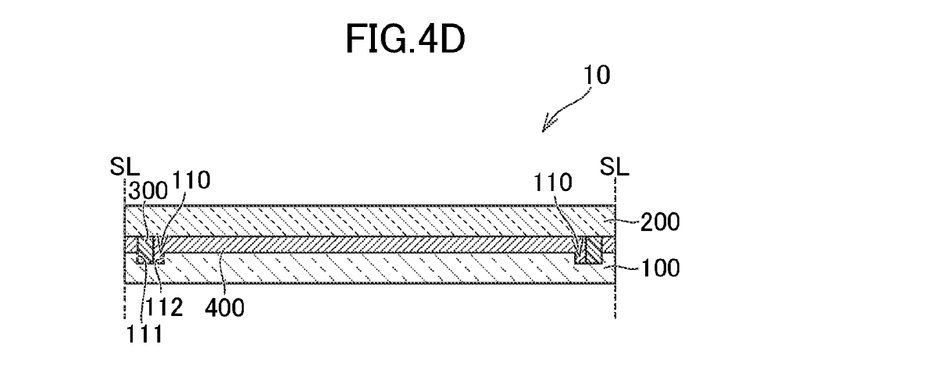
FIG. 4D is a diagram for explaining the method of manufacturing the display device of the first embodiment, and is a sectional view illustrating a state in which the multi-piece panel forming the first substrate and the multi-piece panel forming the second substrate are broken at the scribe lines.

FIG. 4D is a diagram for explaining the method of manufacturing the display device 10 of the first embodiment, and is a sectional view illustrating a state in which the multi-piece panel forming the first substrate 100 and the multi-piece panel forming the second substrate are broken at the scribe lines.

As mentioned above, both of the multi-piece panels 1000 and 2000 are broken, and thus the display device 10 according to the first embodiment can be obtained.

The display device 10 according to the first embodiment manufactured according to the manufacturing method is a display device provided with the substrates in which deterioration of a sectional shape is suppressed.

Display Device of Second Embodiment

A display device 20 according to a second embodiment is different from the display device 10 according to the first embodiment in that a shape of the recess 110 formed in at least one of the first substrate 100 and the second substrate 200. Other configurations are the same as those of the display device 10 according to the first embodiment.

Hereinafter, a description will be made of the recess 110 formed in at least one of the first substrate 100 and the second substrate 200 forming a part of the display device 20 according to the second embodiment.

Figure 5:
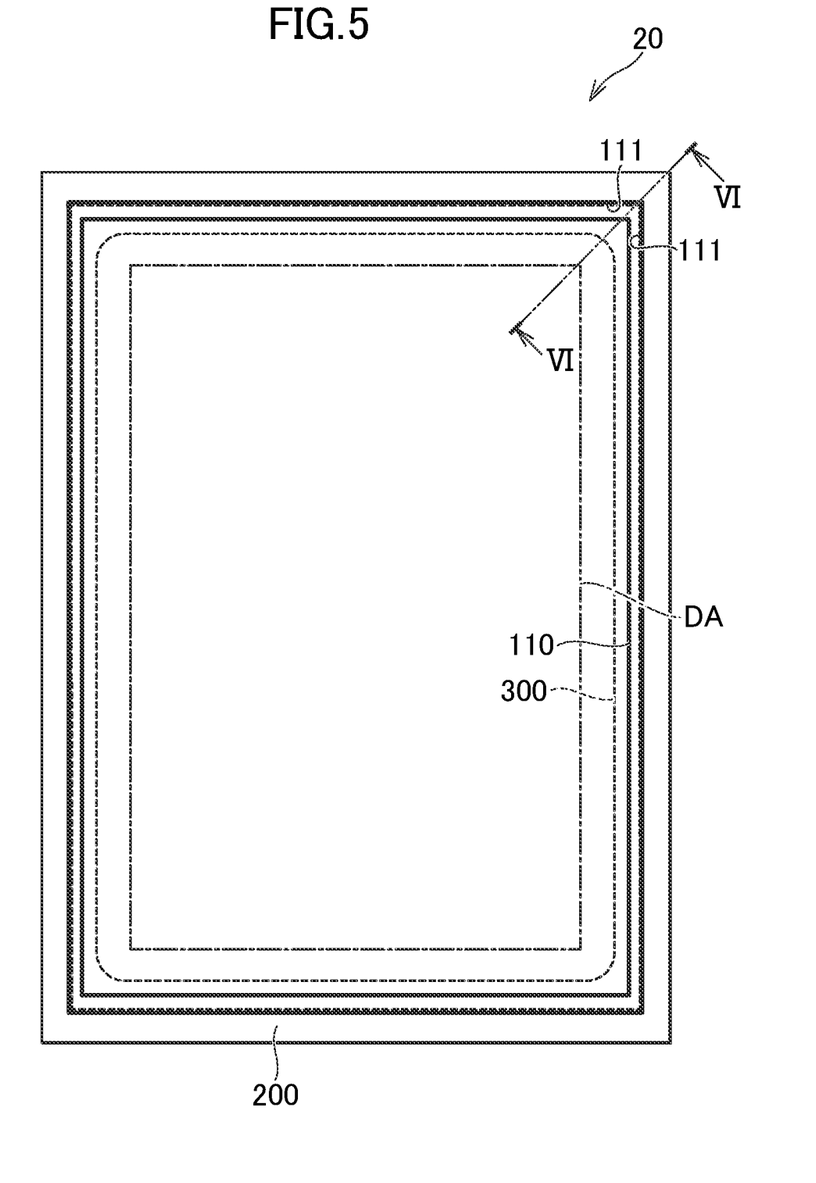
FIG. 5 is a plan view of a display device according to a second embodiment of the present invention.
Figure 6:
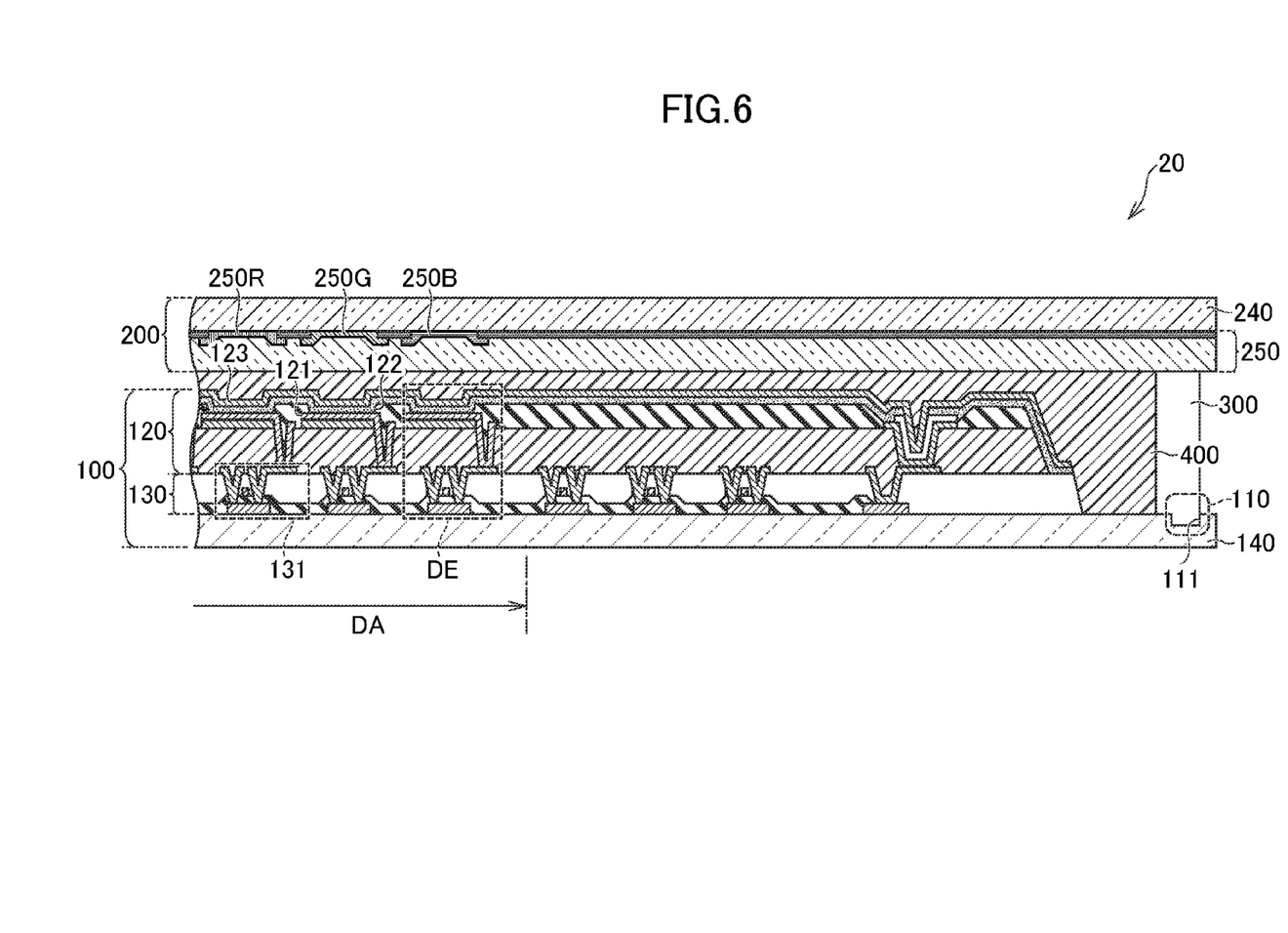
FIG. 6 is a sectional view taken along the line VI-VI in FIG. 5.

FIG. 5 is a plan view of the display device 20 according to a second embodiment of the present invention. FIG. 6 is a sectional view taken along the line VI-VI in FIG. 5.

As illustrated in FIGS. 5 and 6, the first substrate 100 forming a part of the display device 20 according to the second embodiment is provided with the recess 110 formed at positions which are close to four corner portions of the first substrate 100 and overlap at least a part of the region in which the sealant 300 is disposed, in a plan view. The recess 110 is formed to surround the entire periphery of the display region DA in a plan view.

The sealant 300 is disposed along the recess 110 formed to surround the entire periphery of the display region DA. The recess 110 is formed in the first substrate 100 so as to overlap the entire region in which the sealant 300 is disposed in a plan view.

As mentioned above, the recess 110 is formed, and thus the sealant 300 is provided to be disposed at a nearly uniform position with an outer edge of the first substrate 100 over the entire periphery of the display region DA. As described in the method of manufacturing the display device 10 according to the first embodiment, this indicates that a distance between a scribe line (break line) and the sealant can be made more uniform over the entire periphery of the display region in manufacturing steps, and thus it is possible to suppress deterioration of a sectional shape.

Display Device of Third Embodiment

Figure 7:
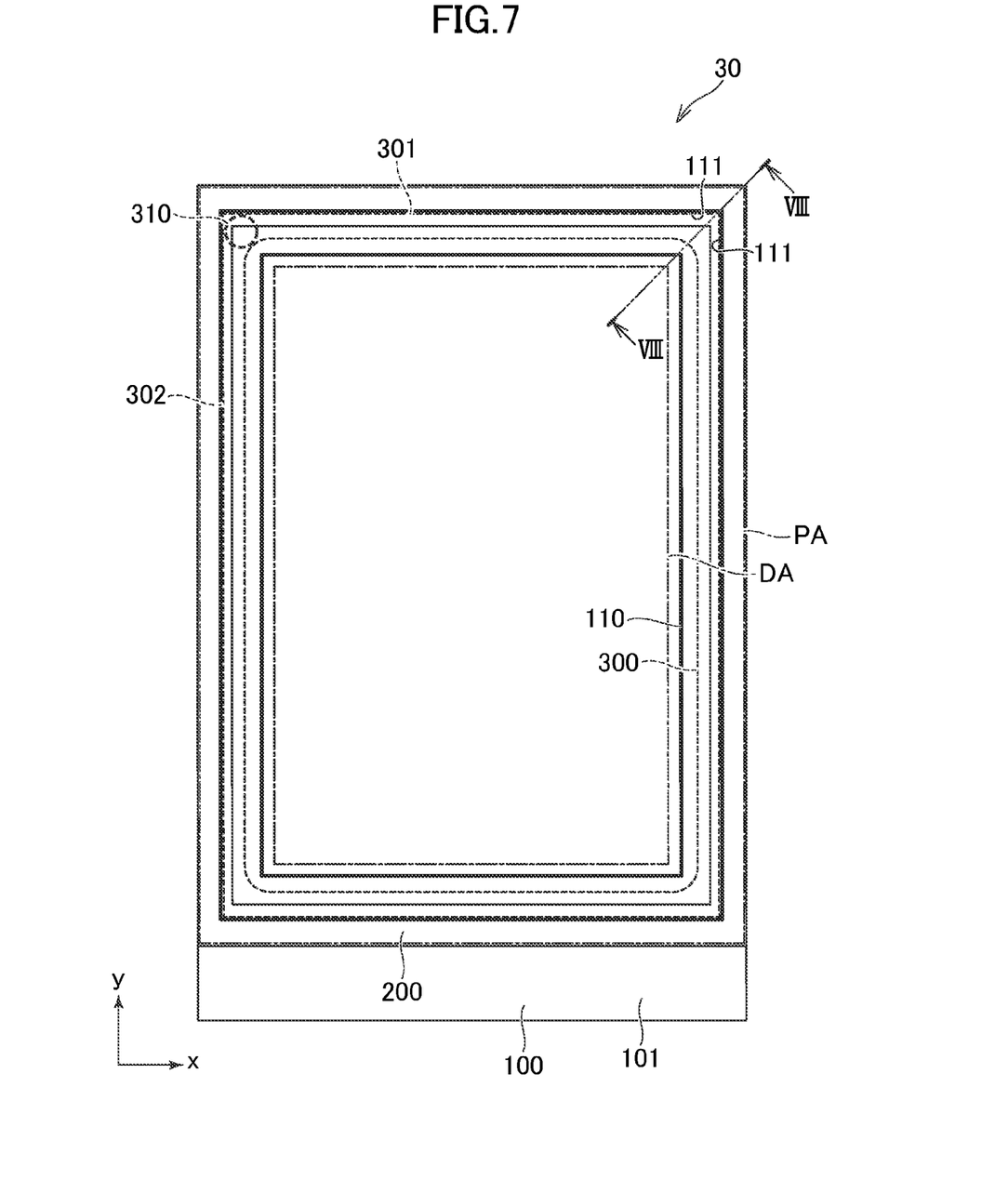
FIG. 7 is a plan view of a display device according to a third embodiment of the present invention.
Figure 8:
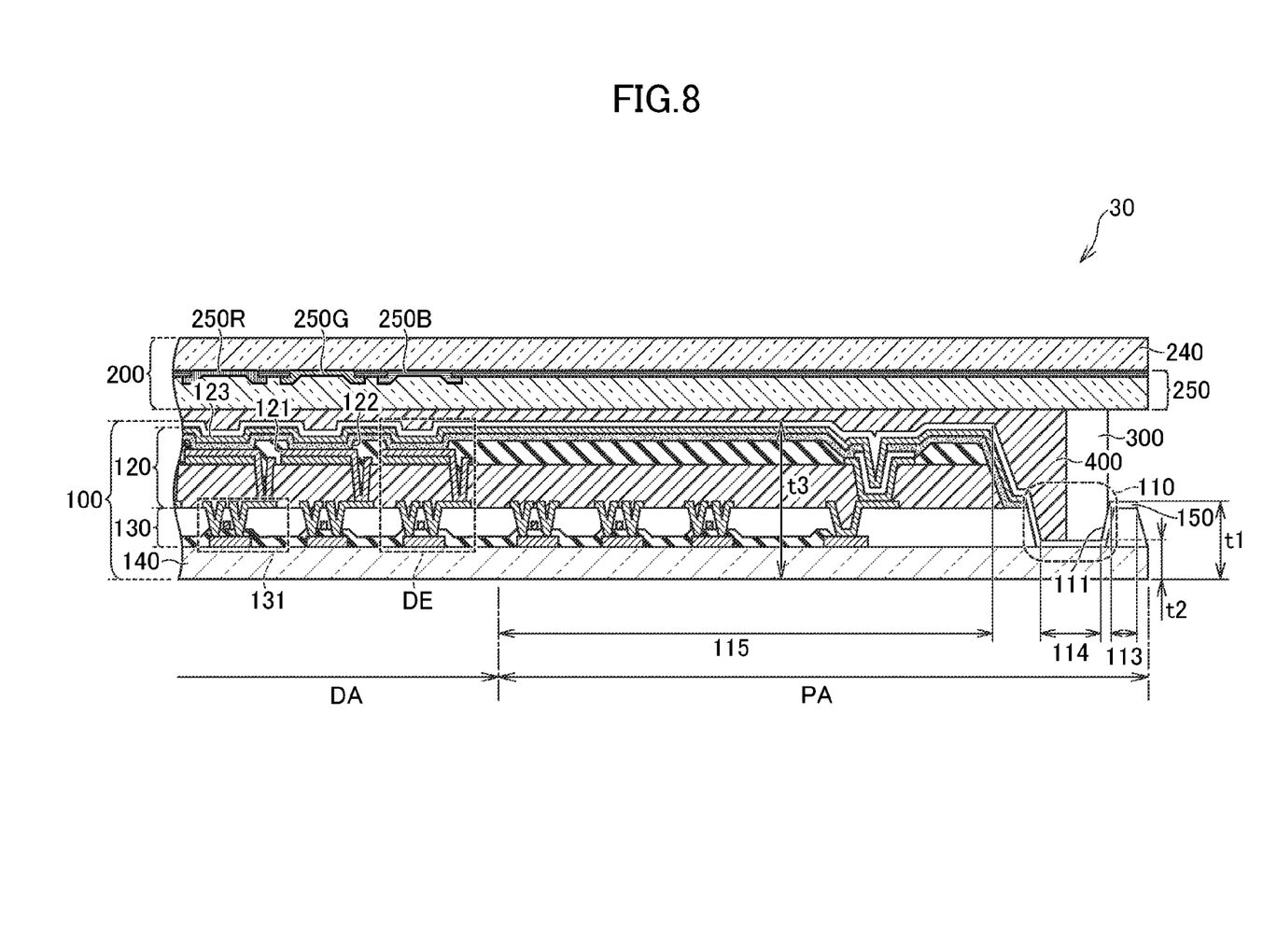
FIG. 8 is a sectional view taken along the line VIII-VIII in FIG. 7.

FIG. 7 is a plan view of a display device 30 according to a third embodiment of the present invention. FIG. 8 is a sectional view taken along the line VIII-VIII in FIG. 7. In the figures, the same constituent elements as those in the above-described embodiments are given the same reference numerals.

The first substrate 100 has a rectangular display region DA and a peripheral region PA surrounding the display region DA. A plurality of display elements DE are disposed in the display region DA. The display device 30 displays an image by controlling light emission of each of the plurality of display elements DE.

Each of the first substrate 100 and the second substrate 200 has a rectangular shape. An outer shape of the second substrate 200 is smaller than an outer shape of the first substrate 100. In other words, as illustrated in FIG. 7, in a case where the first substrate 100 and the second substrate 200 are disposed to overlap each other in a plan view, the first substrate 100 has a protrusion 101 protruding from the second substrate 200.

Thus, in a case where the second substrate 200 is disposed to face the first substrate 100, a partial surface of the first substrate 100 on the side facing the second substrate 200 is exposed. Terminals for inputting information or power from the outside of the panel are formed in the protrusion 101 of the first substrate 100. Light emission of the display elements DE is controlled on the basis of externally input information.

An aspect in which the first substrate 100 has the protrusion 101 is also applicable to the display devices according to the first and second embodiments.

The recess 110 is disposed between the display region DA and an end of the second substrate 200. The recess 110 is disposed in regions between corner portions of the display region DA and corner portions at the ends of the second substrate 200 in a plan view.

The sealant 300 is disposed in the peripheral region PA surrounding the display region DA, and the sealant 300 is interposed between the first substrate 100 and the second substrate 200. The sealant 300 includes a first sealant 301 extending in a first direction (an x direction in FIG. 7) and a second sealant 302 extending in a second direction (a y direction in FIG. 7) intersecting the first direction.

The recess 110 is disposed to overlap an intersection 310 between the first sealant 301 and the second sealant 302 in a plan view.

As illustrated in FIG. 7, the sealant 300 may be continuously disposed in the peripheral region PA along an outer edge of the second substrate 200 in a plan view.

As illustrated in FIG. 7, the recess 110 maybe continuously disposed in the peripheral region PA along the outer edge of the second substrate 200 in a plan view.

In the first substrate 100, a sealing film 150 is disposed on the common electrode 123 serving as a cathode electrode in addition to the layer configuration illustrated in FIG. 1. The sealing film 150 is formed to cover the organic light emission layer 120, and thus prevents moisture from permeating into the organic light emission layer 120 from the outside. In order to prevent permeation of moisture from the outside, the insulating substrate 140 is in contact with the sealing film 150 without using the organic light emission layer 120 at some regions of the display device 30. The display region DA is covered with the sealing film 150, and thus the fill material 400 may not have an effect of preventing permeation of moisture, and the display region DA may be filled with a resin or a gas.

The recess 110 in the present embodiment is formed on the TFT layer 130. The recess 110 is formed not on the insulating substrate 140. Specifically, the recess 110 is formed by using the organic light emission layer 120 or the TFT layer 130.

As illustrated in FIG. 8, the peripheral region PA of the first substrate 100 includes a first region 113 which is close to the end of the first substrate 100 and is provided in a portion where a thickness of the first substrate 100 is a first thickness (a width t1 in FIG. 8); a second region 114 which is located between the first region 113 and the display region DA and is provided in a portion where a thickness of the first substrate 100 is a second thickness (a width t2 in FIG. 8); and a third region 115 which is located between the second region 114 and the display region DA and is provided in a portion where a thickness of the first substrate 100 is a third thickness (a width t3 in FIG. 8).

The first substrate 100 has the recess 110 having the second region 114 as a bottom as a result of each of the first thickness (the width t1 in FIG. 8) and the third thickness (the width t3 in FIG. 8) being set to be larger than the second thickness (the width t2 in FIG. 8).

The intersection 310 at which the first sealant 301 and the second sealant 302 intersect each other is located in a region overlapping the second region 114 in a plan view.

In the present embodiment, the recess 110 is formed by using the insulating film of the TFT layer 130, but may also be formed by using the organic light emission layer 120 in addition to the TFT layer 130.

According to the present embodiment, a wiring is not required to be disposed to avoid the recess 110, and thus the wiring is easily laid out. The wiring is not influenced by a step difference of the recess, and can thus be prevented from being disconnected due to the step difference.

In a case where the recess is formed by using a film on the insulating substrate, as illustrated in FIG. 5, the recesses is preferably continuously formed along the outer edge of the second substrate 200 in the peripheral region PA. If the recess is continuously formed over the entire periphery, and the sealant 300 is continuously disposed on a second surface 114 which is a bottom of the recess, it is possible to prevent moisture from permeating into the display region DA.

With the above-described configuration, the first substrate 100 and the second substrate 200 can be reliably adhered to each other via the sealant 300 at the corner portions, and thus it is possible to prevent the corner portions of the glass substrate from chipping. In a case where the first substrate 100 and the second substrate 200 are made of flexible materials, it is possible to prevent both of the substrates from being peeled off at corner portions thereof.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
a first substrate that is provided with a display element in a display region;
a second substrate that faces the first substrate and is disposed on a side of the first substrate where the display element is provided; and
a sealant that bonds the first substrate and the second substrate to each other in a region surrounding the periphery of the display region in a plan view,
wherein each of the first substrate and the second substrate has a rectangular shape,
wherein at least one of the first substrate and the second substrate has a plurality of first corner portions and a plurality of the recesses which are respectively close to the plurality of first corner portions and overlap at least a part of the region in which the sealant is disposed,
wherein each of the recesses is not connected to the other recesses,
wherein each of recesses has a second corner portion which is close to one of the first corner portions,
wherein each of the recesses has a first inner wall extending from the second corner portion, the inner wall is parallel to one edge of the first substrate,
wherein each of the recesses has a second inner wall extending from an end of the first inner wall,
wherein the sealant gets over the second inner wall, and extends in a first direction outside each of the recesses,
wherein a distance from the second corner portion to an inner side of the sealant is greater than the width of the sealant in a second direction orthogonal to the first direction, and
wherein the sealant is provided to be in contact with at least a surface far from the display region among inner surfaces of the recess.

2. The display device according to claim 1,
wherein the recess surrounds the entire periphery of the display region in a plan view.

3. The display device according to claim 1,
wherein the at least one of the first substrate and the second substrate is a glass substrate.

4. The display device according to claim 1,
wherein the at least one of the first substrate and the second substrate is a resin substrate.

5. The display device according to claim 1,
wherein the sealant is separated from at least a portion of a surface close to the display region among the inner surfaces of the recess.

6. The display device according to claim 1,
wherein the recess is provided to overlap the entire region where the sealant is disposed in a plan view.

7. The display device according to claim 1,
wherein each of the first substrate and the second substrate has a rectangular shape, and the first substrate has a protrusion protruding from the second substrate.

8. A display device comprising:
a first substrate that has a display region in which a plurality of display elements are disposed, and a peripheral region surrounding the display region;
a second substrate that faces the first substrate; and
a sealant that is interposed between the first substrate and the second substrate, and is located in the peripheral region,
wherein the peripheral region includes a first region which is close to an end of the first substrate and in which a thickness of the first substrate is a first thickness; a second region which is located between the first region and the display region and in which a thickness of the first substrate is a second thickness; and a third region which is located between the second region and the display region and in which a thickness of the first substrate is a third thickness,
wherein each of the first thickness and the third thickness is larger than the second thickness thereby forming a recess having a bottom on the second region,
wherein the sealant includes a first sealant extending in a first direction and a second sealant extending in a second direction intersecting the first direction,
wherein an intersection where the first sealant and the second sealant intersect each other is located in a region overlapping the second region in a plan view, and
wherein a first distance in at least one direction of the first direction and the second direction between one of a plurality of edges of the first substrate and an inner side of the sealant in the intersection is greater than a second distance in the at least one direction between the one edge of the first substrate and the inner side of the sealant outside of the second region.

9. The display device according to claim 8,
wherein the sealant is continuously disposed in the peripheral region along an outer edge of the second substrate in a plan view.

10. The display device according to claim 8,
wherein the recess surrounds the entire periphery of the display region in a plan view.

11. The display device according to claim 8,
wherein the at least one of the first substrate and the second substrate is a glass substrate.

12. The display device according to claim 8,
wherein the at least one of the first substrate and the second substrate is a resin substrate.

13. The display device according to claim 8,
wherein the sealant is separated from at least a surface close to the display region among the inner surfaces of the recess.

14. The display device according to claim 8,
wherein each of the first substrate and the second substrate has a rectangular shape, the first substrate has a protrusion protruding from the second substrate.

\* \* \* \* \*